United States Patent [19]
Wu

[11] Patent Number: 5,335,722
[45] Date of Patent: Aug. 9, 1994

[54] COOLING ASSEMBLY FOR AN INTEGRATED CIRCUIT

[75] Inventor: Shuenn-Jenq Wu, Taipei, Taiwan

[73] Assignees: Global Win Technology Co., Ltd; Huei Bin Enterprise Corp., Taiwan

[21] Appl. No.: 129,754

[22] Filed: Sep. 30, 1993

[51] Int. Cl.⁵ ............................................... H05K 7/20
[52] U.S. Cl. .................................. 165/122; 165/80.3; 361/697; 257/722
[58] Field of Search .................. 165/80.3, 122; 174/16.1, 16.3; 361/696, 697; 257/713, 719, 722

[56] References Cited

U.S. PATENT DOCUMENTS

| | | | |
|---|---|---|---|
| 4,679,118 | 7/1987 | Johnson et al. | 174/16.3 X |
| 4,682,268 | 7/1987 | Ohano et al. | 361/697 |
| 4,804,172 | 2/1989 | Soboloosby et al. | 165/80.3 X |
| 5,036,384 | 7/1991 | Urugawa | 257/719 X |

*Primary Examiner*—John C. Fox
*Attorney, Agent, or Firm*—McCubbrey, Bartels & Ward

[57] ABSTRACT

A cooling assembly includes a fin, a fan retained above the fin, and a housing. The fin includes a bottom surface for contacting an upper surface of the integrated circuit and an upper surface from which a plurality of ridges extend, each two adjacent ridges defining a channel therebetween. A plurality of venting openings are formed in a top wall of the hollow housing. A plurality of snapping members project downwardly from two mutually facing side walls of the hollow housing and each of which having a distal flexible snapping end for releasably engaging with an underside of the integrated circuit. A pair of ribs are formed in an upper section of each of two mutually facing inner sides of the side walls of the hollow housing, the distance between opposite ribs being equal to a width of the integrated circuit. A plurality of oblique flexible pieces extend from an inner side of the top wall of the hollow housing. A groove is formed in an outer side of each of two outermost ridges and extends along a longitudinal direction of the ridges, and a protrusion is formed in a lower section of each of two mutually facing inner sides of the side walls of the hollow housing for engaging with an associated groove.

5 Claims, 3 Drawing Sheets

COOLING ASSEMBLY FOR AN INTEGRATED CIRCUIT

BACKGROUND OF THE INVENTION

1. Field of the Invention

The present invention relates to a cooling assembly for an integrated circuit.

2. Description of the Related Prior Art

Generally, large integrated circuits are equipped with fin and fan assembly to reduce the working temperature to prevent damage. Taking an 80486 central processing unit (CPU) for example, the working temperature thereof may reach 170° F., which is very close to 185° F.—the tolerable critical working temperature. Cooling devices are accordingly required to cool the integrated circuits during operation. However, in currently available cooling devices for integrated circuits, it is found that the cooling device cannot be effectively and/or efficiently secured in position. Furthermore, the fastening members of conventional cooling devices have fixed leg lengths and thus have a limited use when being used to secure the CPUs of various thicknesses. In some cases, even though the leg length of a fastening member mates with the thickness of the CPU, the fastening member still cannot engage with the CPU due to manufacturing tolerance. Some prior art cooling devices use fans which are mounted to the fins by screws, which not only requires time but also damages the fin structure. The present invention intends to provide an improved cooling assembly which can be used to secure the CPUs of various thicknesses and can be easily mounted to and detached from the CPUs.

SUMMARY OF THE INVENTION

The present invention provides a cooling assembly for dissipating heat generated by an integrated circuit, including a fin, a fan, and a hollow housing for fittingly housing the integrated circuit, the fin, and the fan.

The fin includes a bottom surface for contacting an upper surface of the integrated circuit and an upper surface from which a plurality of ridges extend, each two adjacent ridges defining a channel therebetween. A groove is formed in an outer side of each of two outermost ridges and extends along a longitudinal direction of the ridges.

The hollow housing comprises a top wall, four side walls, and an opening in a bottom thereof. A plurality of venting openings are formed in the top wall and a plurality of venting openings may be formed in at least one of the side walls. A pair of spaced snapping members project downwardly from each of two mutually facing side walls of the hollow housing and each of which having a distal flexible snapping end for releasably engaging with an underside of the integrated circuit. A protrusion is formed in a lower section of each of two mutually facing inner sides of the side walls of the hollow housing for engaging with an associated groove in each of the two outermost ridges.

Preferably, a pair of ribs are formed in an upper sections of each of two mutually facing inner sides of the side walls of the hollow housing, the distance between opposite ribs being equal to a width of the integrated circuit. Furthermore, a plurality of oblique flexible pieces extend from an inner side of the top wall of the hollow housing.

After assembly, the snapping members exert an upward force to the integrated circuit, the fin, and the fan, while the oblique flexible pieces exert a downward force to the fan, the fin, and the integrated circuit, thereby providing a reliable engagement therebetween.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
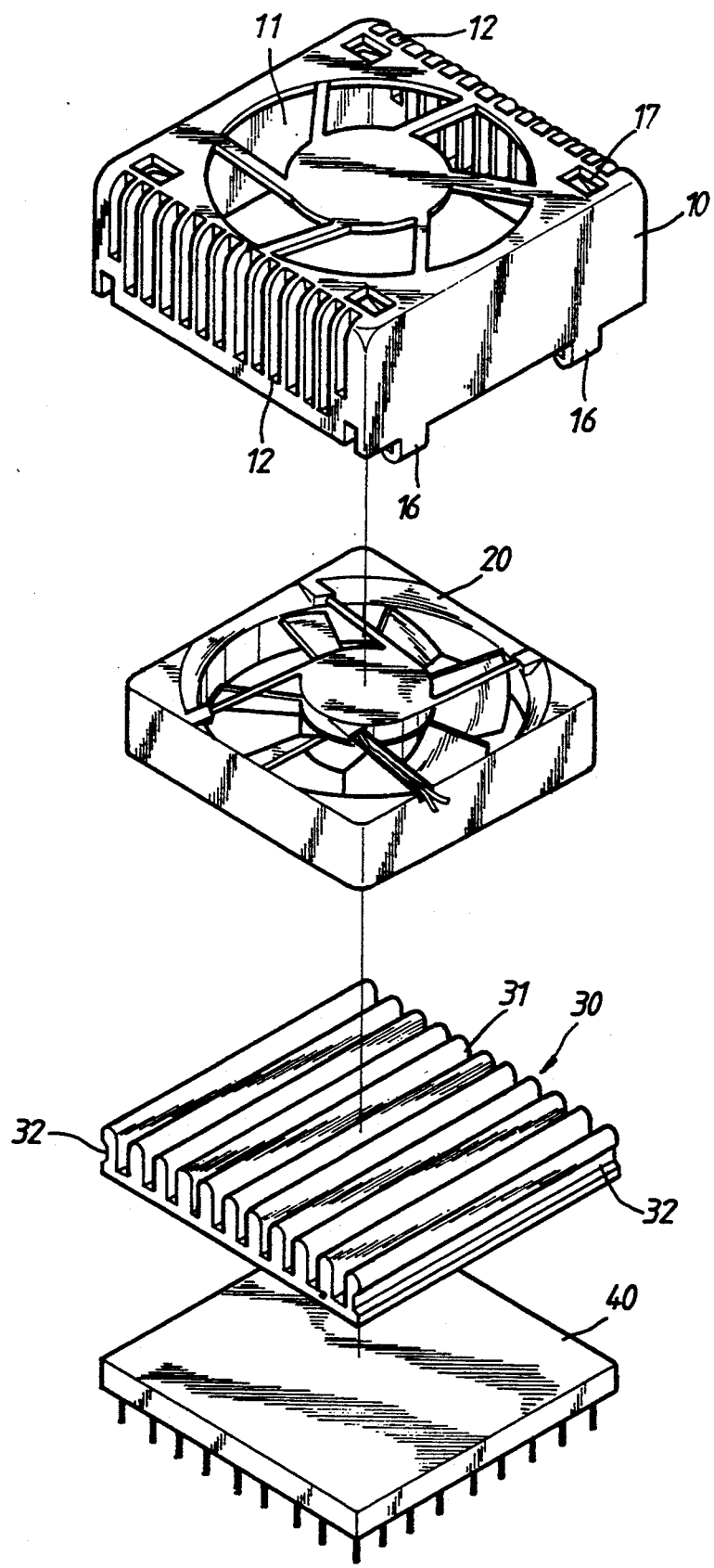
FIG. 1 is an exploded perspective view of an integrated circuit and a cooling assembly in accordance with the present invention.
Figure 2:
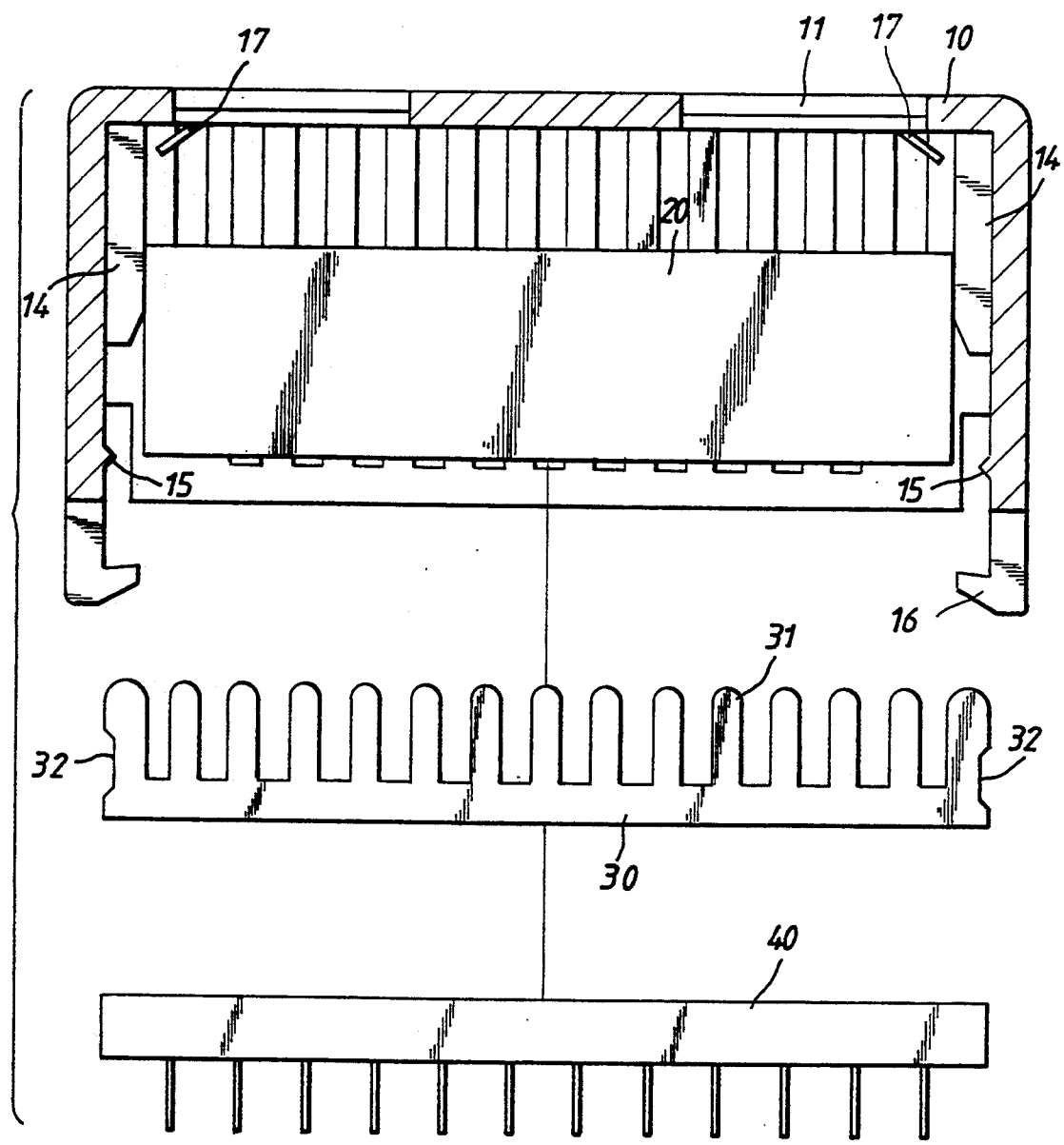
FIG. 2 is an exploded side view, partly sectioned, of the cooling assembly and the integrated circuit.
Figure 3:
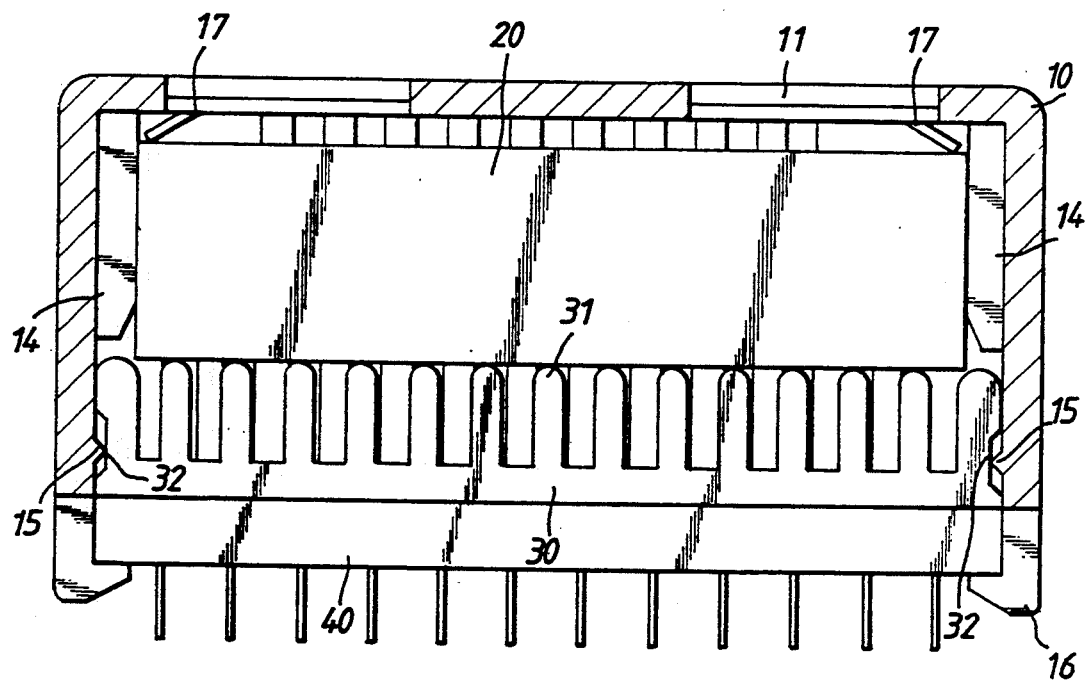
FIG. 3 is a side elevational view, partly sectioned, of the cooling assembly and the integrated circuit in an assembled status.

Referring to FIGS. 1 through 3, the present invention provides a cooling assembly for dissipating heat generated by an integrated circuit 40, including a fin 30, a fan 20, and a hollow housing 10 for fittingly housing the integrated circuit 40, the fin 30, and the fan 20.

The fin 30 includes a bottom surface for contacting an upper surface of the integrated circuit 40 and an upper surface from which a plurality of ridges 31 extend, each two adjacent ridges 31 defining a channel therebetween. A groove 32 is formed in an outer side of each of two outermost ridges 31 and extends along a longitudinal direction of the ridges 31.

The hollow housing 10 comprises a top wall, four side walls, and an opening in a bottom thereof. A plurality of venting openings 11 are formed in the top wall and a plurality of venting openings 12 may be formed in at least one of the side walls of the hollow housing 10 (see FIG. 1). A pair of spaced snapping members 16 project downwardly from two mutually facing sides of the hollow housing 10 and each of the snapping members 16 has a distal flexible snapping end for releasably engaging with an underside of the integrated circuit. A protrusion 15 is formed in a lower section of each of two mutually facing inner sides of the side walls of the hollow housing 10 for engaging with an associated groove 32.

Preferably, a pair of ribs 14 are formed in upper sections of two mutually facing inner sides of the side walls of the hollow housing 10, the distance between opposite ribs 14 being equal to a width of the integrated circuit 40 (see FIG. 2). Furthermore, a plurality of oblique flexible pieces 17 extend downward from an inner side of the top wall of the hollow housing 10.

In assembly, the fan 20 is firstly inserted into the housing 10 and is retained between the ribs 14. Then, the fin 30 is inserted into the housing 10 with the grooves 32 in the outermost two ridges 31 engaging with the protrusions 15. Thereafter, the integrated circuit 40 is inserted into the extension space in the hollow housing 10 defined by the snapping members 16, as shown in FIG. 3.

Referring to FIG. 3, the snapping meters 16 exert an upward force to the integrated circuit 40, the fin 30, and the fan 20, while the oblique flexible pieces 17 exert a downward force to the fan 20, the fin 30, and the integrated circuit 40, thereby providing a reliable engagement therebetween. The assembled integrated circuit 40 and its cooling assembly are then mounted to a printed circuit board.

Preferably, the other two side walls (on which no snapping member is provided) of the hollow housing 10 extend downwardly to prevent sliding movement of the integrated circuit 40 along the longitudinal direction of the fin 30.

According to the above description, it is appreciated that the cooling assembly provided by the present invention can be used to secure CPUs of various thicknesses and can be easily mounted to and detached from the CPUs due to the provision of the flexible snapping members 16 and the oblique flexible pieces 17.

Although the invention has been explained in relation to its preferred embodiment, it is to be understood that many other possible modifications and variations can be made without departing from the spirit and scope of the invention as hereinafter claimed.

I claim:

1. A cooling assembly for dissipating heat generated by an integrated circuit, comprising:
   a fin including a bottom surface for contacting an upper surface of an integrated circuit and an upper surface from which a plurality of ridges extend, each two adjacent said ridges defining a channel therebetween;
   a fan retained above said ridges; and
   a hollow housing for fittingly housing said integrated circuit, said fin, and said fan, said hollow housing comprising a top wall, four side walls, and an opening in a bottom thereof, a plurality of venting openings being formed in said top wall, and a plurality of snapping members projecting downward from each of two mutually facing sides of said hollow housing and each of which having a distal flexible snapping end for releasably engaging with an underside of said integrated circuit.

2. The cooling assembly as claimed in claim 1 further comprising a rib means formed in an upper section of each of two mutually facing inner sides of said side walls of said hollow housing, said rib means having a distance therebetween equal to a width of said integrated circuit.

3. The cooling assembly as claimed in claim 1 further comprising a plurality of oblique flexible pieces extending downwardly from an inner side of said top wall of said hollow housing.

4. The cooling assembly as claimed in claim 1 wherein a groove is formed in an outer side of each of two outermost ridges and extends along a longitudinal direction of said ridges, and a protrusion is formed in a lower section of each of two mutually facing inner sides of said side walls of said hollow housing for engaging with associated said groove.

5. The cooling assembly as claimed in claim 1 further comprising a plurality of venting openings formed in at least one of said side walls of said hollow housing.

* * * * *